US006731170B2

(12) United States Patent
Juang

(10) Patent No.: US 6,731,170 B2
(45) Date of Patent: May 4, 2004

(54) SOURCE DRIVE AMPLIFIER OF A LIQUID CRYSTAL DISPLAY

(75) Inventor: Dar-Chang Juang, Hsinchu (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 391 days.

(21) Appl. No.: 09/892,759

(22) Filed: Jun. 28, 2001

(65) Prior Publication Data

US 2003/0052854 A1 Mar. 20, 2003

(51) Int. Cl.[7] ..................... H03F 3/45; H03F 3/26; G09G 3/36

(52) U.S. Cl. ..................... 330/261; 330/262; 345/96

(58) Field of Search ..................... 345/96, 92, 104; 330/253, 262, 261; 341/155

(56) References Cited

U.S. PATENT DOCUMENTS 5,467,090 A * 11/1995 Baumgartner et al. ...... 341/155
5,917,378 A * 6/1999 Juang ..................... 330/253
6,377,121 B1 * 4/2002 Giduturi ..................... 330/253
6,559,821 B2 * 5/2003 Ichikawa et al. ............ 345/92

* cited by examiner

*Primary Examiner*—Steven Saras
*Assistant Examiner*—Uchendu O. Anyaso
(74) *Attorney, Agent, or Firm*—Bacon & Thomas, PLLC

(57) ABSTRACT

A source drive amplifier has a first input circuit controlled by a polarity switching signal for being switched into an NMOS differential amplifying circuit or a bias circuit, and a second input circuit controlled by a polarity switching signal for being switched into a bias circuit or a PMOS differential amplifying circuit. The output of the first input circuit switched into an NMOS differential amplifying circuit drives the PMOS transistor of an output transistor pair for being used as a source out amplifying output stage, and a current provided by the NMOS transistor is used as a bias. The output of the second output circuit switched into a PMOS differential amplifying circuit drives the NMOS transistor of the output transistor pair for being used as a sink in amplifying output stage, and a current provided by the PMOS transistor is used as a bias.

9 Claims, 8 Drawing Sheets

SOURCE DRIVE AMPLIFIER OF A LIQUID CRYSTAL DISPLAY

BACKGROUND OF THE INVENTION

1. Field of the Invention

The present invention relates to a source drive amplifier of a liquid crystal display and, more particularly, to a source drive amplifier used in, for example, the driving circuit of a thin film transistor liquid crystal display.

2. Description of Related Art

The thin film transistor liquid crystal display (TFT LCD) is known as an active array type display. The array is composed of a plurality of pixels (or dots), each having a driving electrode and a common electrode commonly used with the other pixels. The LCD is driven by an AC (alternative current) signal. That is, if the voltage applied to the driving electrode is positive with respect to that of the common electrode when the first frame is displayed, the voltage applied to the driving electrode is negative with respect to that of the common electrode in the next frame.

Under the consideration of the difference of the common electrodes and the image quality, there are two well-known driving methods provided: dot inversion driving and row inversion driving. In the dot inversion driving system, if the odd dots of the odd lines of the first frame are driven by a positive voltage with respect to the common electrode, the even dots of the odd lines of the first frame are driven by a negative voltage with respect to the common electrode. The odd dots of the even lines of the first frame are driven by a negative voltage with respect to the common electrode, and the even dots are driven by a positive voltage with respect to the common electrode.

Then, the odd dots of the odd lines of the second frame are driven by a negative voltage with respect to the common electrode, and the even dots are driven by a positive voltage with respect to the common electrode. Meanwhile, the odd points of the even lines of the second frame are driven by a positive voltage with respect to the common electrode, and the even points are driven by a negative voltage with respect to the common electrode.

In the row inversion system, if all dots of the odd lines of the first frame are driven by a positive voltage with respect to the common electrode, all the dots of the even lines of the first frame will be driven by a negative voltage with respect to the common electrode. Then, all dots of the odd lines of the second frame are driven by a negative voltage with respect to the common electrode, and all dots of the even lines of the second frame are driven by a positive voltage with respect to the common electrode.

FIG. 5 is a schematic view showing the driving structure of an active thin film liquid crystal display with K columns by L rows. As shown in the figure, If there are K pixels 901 in the horizontal direction, K channels of source drive units (SDUs) are required for driving. In the vertical direction, a gate driver 903 is employed to drive the voltages of the pixels 901 on each scanning line 904 sequentially for being sampled and hold on the driving electrode of each pixel 901.

FIG. 6 is a circuit diagram of the source drive unit 902 of an active thin film liquid crystal display, which has a multiplex (MUX) 911 controlled by a polarity switching signal PN for switching the output of a positive digital to analog converter 912 (P-DAC) or negative digital to analog converter 913 (N-DAC) to a voltage follower formed by an operational amplifier 914, thereby amplifying the driving ability to generate a driving output DRVO. The driving output DRVO is then entered to a CMOS transmission gate 915 controlled by an output enable signal (OE) to output a driving voltage VLCD to the column of the panel of a thin film transistor liquid crystal display. The operating waveforms are illustrated in FIG. 7, wherein the P-DAC 912 and N-DAC 913 are controlled by an input digital data so as to generate a driving voltage required by a respective illumination. The outputs of the P-DAC 912 and N-DAC 913 are similar, but symmetric with respect to the common electrode, so as to satisfy the AC driving requirement.

To save power, the output voltages of the P-DAC 912 and N– DAC 913 are generally in the range from VSS+0.1V to VDD−0.1V. Therefore, the operational amplifier used in the source drive unit 902 must have the capability of fill rail-to-rail. Moreover, when the output is higher than the voltage of the common electrode, a large current source out is required so that the load capacitor (primarily the layout strayed capacitor on the panel of the thin film transistor liquid crystal display) is charged rapidly to a high voltage. Moreover, when the output is lower than the voltage of the common electrode, a large current sink capability is required for discharging the high voltage of the load capacitor of the thin film transistor liquid crystal display to a driving low voltage.

To match this requirement, the circuit of an operational amplifier used in a conventional source drive unit is disclosed as shown in FIG. 8, which is a full rail-to-rail AB class operational amplifier (a detailed description of such can be found in U.S. Pat. No. 6,100,762). The operational amplifier includes a first differential amplifier formed by an NMOS pair (N1, N2) and a second differential amplifier formed by a PMOS pair (P1, P2). The two differential amplifiers are connected in parallel for being used as an input. The output currents of the two differential amplifiers are summed via a current mirror circuit (N5_N6, N7_N8, P5_P6), and outputted at node A to drive the AB class amplifier formed by transistors N9, N10, N12, N13, N14, P10, P11, and P12) for being used as the output of the operational amplifier, so as to acquire a large current source out and sink in capabilities.

The aforesaid conventional operational amplifier suffers a disadvantage in having a very large DC offset. Such a disadvantage is encountered because the threshold voltages ($V_{TH}$) of different MOS devices may be varied from ± several mV to ± several tens of mV, in the CMOS manufacturing process. Moreover, in the full rail-to-rail AB class amplifier, the DC offset caused by $V_{TH}$ is particularly serious, which is analyzed as follows:

when $V_{in} < V_{\mathrm{TH\_N1}}$, $$V_{\mathrm{OS\_L}} = \frac{gm_{PI}\Delta V_{\mathrm{TH\_P1P2}} + gm_{N5}\Delta V_{\mathrm{TH\_N5N6}} + gm_{N7}\Delta V_{\mathrm{TH\_N7N8}} + gm_{\mathrm{P5\_L}}\Delta V_{\mathrm{TH\_P5P6}}}{gm_{PI}}$$

when $V_{\mathrm{TH\_N1}} < V_{in} < (V_{DD} - V_{\mathrm{TH\_P1}})$, $$V_{\mathrm{OS\_M}} = \frac{gm_{PI}\Delta V_{\mathrm{TH\_P1P2}} + gm_{NI}\Delta V_{\mathrm{TH\_N1N2}} + gm_{N5}\Delta V_{\mathrm{TH\_N5N6}} + gm_{N7}\Delta V_{\mathrm{TH\_N7N8}} + gm_{\mathrm{P5\_M}}\Delta V_{\mathrm{TH\_P5P6}}}{gm_{PI} + gm_{NI}}$$

when $(V_{DD} - V_{\mathrm{TH\_P1}}) < V_{in}$, $$V_{\mathrm{OS\_H}} = \frac{gm_{NI}\Delta V_{\mathrm{TH\_N1N2}} + gm_{\mathrm{P5\_H}}\Delta V_{\mathrm{TH\_P5P6}}}{gm_{NI}};$$

wherein $gm_{Pi}$, $gm_{Nj}$ represent the transfer-conductance of PMOS transistor (Pi, i=1, 2, 3 . . . ), and the transfer-conductance of NMOS transistor (Nj, j=1, 2, 3 . . . ); the $gm_{P5\_H}$ $gm_{P5\_M}$, $gm_{P5\_L}$ are different from each other due to conducting current; $\Delta V_{TH\_N1N2}$ represents the difference of the voltage threshold between the NMOS differential pair N1 and N2. Other differential pairs or current mirror pairs are represented by same symbols.

In practical, in the middle voltage section $V_{TH\_N1}<V_{in}<(V_{DD}-V_{TH\_PI})$; this AB class operational amplifier generally has a DC offset as high as ±15 mV, or even ±20 mV, and when in a low voltage, $V_{in}<V_{TH\_N1}$, the DC offset is as high as ±40 mV.

An active thin film transistor liquid crystal display may use several thousand channels of source drive units. If such a large DC offset is existed in each channel, it implies that the voltage driven to each pixel has different constant error, which will cause a bad uniformity in display.

Besides, the gain of this AB class operational amplifier is very large. Such a large gain and the strayed capacitor in the node B of FIG. 8 will introduce an inductance in the output impedance. This inductance will resonate with the capacitor of the liquid crystal display to generate a peak gain. Thus, the gain margin of the amplifier will be insufficient, and an oscillation is likely to occur. To avoid the oscillation, the compensation capacitor CC must be enlarged, but this will decrease the bandwidth of the amplifier. As a result, the voltage skew rate is insufficient and the load of the liquid crystal display can not be driven in a high speed. Therefore, the NMOS transistor N4 and PMOS transistor P4 are necessary to be used for turbo bias, so as to provide a common mode positive feedback to speed up the voltage variation rate. However, as shown in FIG. 9, after adding common mode positive feedback, a large overshoot will be encountered in the front edge of the waveform. The voltage can be sampled and hold in the driving electrode of the LCD only after the overshoot disappears. Therefore, the driving speed is still restricted.

In the operational amplifier disclosed in Japan Patent Publication No. 09-018253, a source drive unit uses half of the A class amplifiers with NMOS differential inputs as a source amplifier to provide a large current source out capability, and uses half of A class amplifiers with PMOS differential inputs as a sink amplifier. The input of the source amplifier is always connected to the P-DAC and the input of the sink amplifier is always connected to the N-DAC.

Although the aforesaid circuit structure may provide a low DC offset, the source amplifier has only powerful source out capability, while the pull down capability is only of several $\mu$A. Therefore, when the output driving voltage of a scanning line is much lower than that of the previous one, a very long time is necessary for pulling down the driving voltage to a required voltage (which is still larger than the voltage of a common electrode). Similarly, the sink amplifier also has the problem of slow pull high. Therefore, the system must perform an extra potential reset operation. That is, a CMOS transmission gate must be used between two lines for quickly charging and discharging the load capacitance of the liquid crystal display to a voltage of the common electrode. This will increase the complex of the circuit and control signals. The more worse is that several are necessary for performing potential reset operation and thus, the driving speed will be restricted.

In addition, only one half of the amplifiers in the driver of the aforesaid circuit structure have a large current source out capability, while another half has only a current source out capability of several $\mu$A. Therefore, it can not be used in the row inversion driving scheme because, in row inversion driving, all the pixels of the line are driven by the positive voltage with respect to the common electrode or by the negative voltage with respect to the common electrode. Consequently, the use thereof is restricted and thus, it is desired for the above conventional circuit to be improved.

SUMMARY OF THE INVENTION

The object of the present invention is to provide a source drive amplifier of a liquid crystal display for effectively eliminating the DC offset problem. The present source drive amplifier can be used in the dot inversion system and row inversion system without the need of potential reset.

To achieve the object, the source drive amplifier of a liquid crystal display in accordance with the present invention, comprises: a first input circuit controlled by a polarity switching signal for being selectively switched into an NMOS differential amplifying circuit and a bias circuit; a second input circuit controlled by a polarity switching signal for being selectively switched into a bias circuit and a PMOS differential amplifying circuit, wherein, when the polarity switching signal is in a first state, the first and second input circuits are switched into an NMOS differential amplifying circuit and a bias circuit, respectively, and when the polarity switching signal is in a second state, the first and second input circuits are switched into a bias circuit and a PMOS differential amplifying circuit; and, an output transistor pair having an NMOS transistor and a PMOS transistor, wherein, an output of the first input circuit switched into an NMOS differential amplifying circuit drives the PMOS transistor of the output transistor pair for being used as a source out amplifying output stage, and a current provided by the NMOS transistor is used as a bias; and an output of the second output circuit switched into a PMOS differential amplifying circuit drives the NMOS transistor of the output transistor pair for being used as a sink in amplifying output stage, and a current provided by the PMOS transistor is used as a bias.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
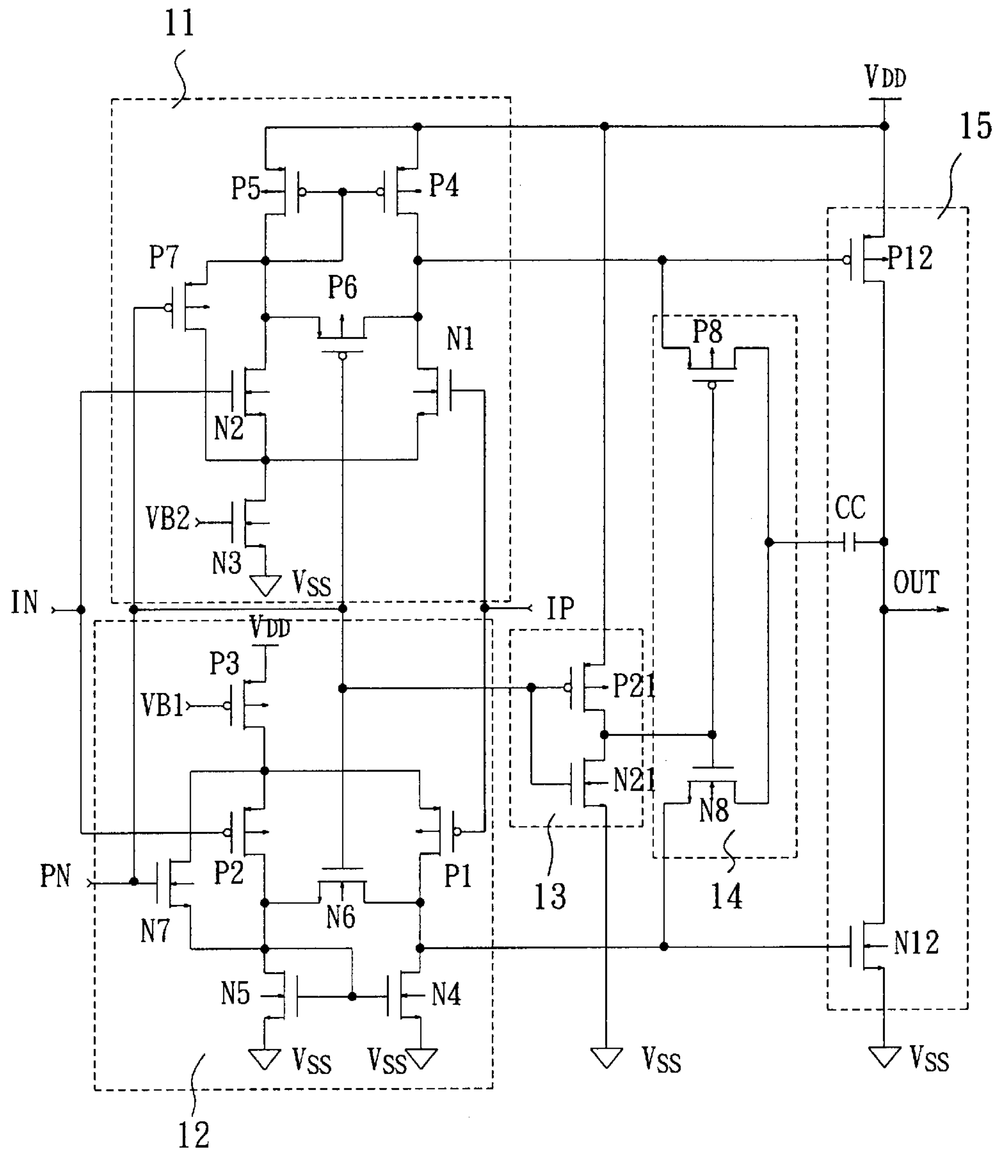
FIG. 1 is a circuit diagram of the source drive amplifier of a liquid crystal display in accordance with the present invention.

With reference to FIG. 1, a preferred embodiment of the source drive amplifier of a liquid crystal display in accordance with the present invention is illustrated. The source drive amplifier is composed of a first input circuit 11, a second input circuit 12, an inverter 13, a switching circuit 14, a compensation capacitor CC, and an output transistor pair 15. The first input circuit 11 and second input circuit 12 are substantially symmetric, and are controlled by a polarity switching signal terminal PN to switch the structure of the amplifier.

The first input circuit 11 is formed by NMOS transistors N1, N2, N3, and PMOS transistors P4, P5, P6 and P7. The sources of the transistors N1 and N2 are connected to the drains of the transistors N3 and N7. The gates of the transistors N1, P6 and P4 are connected together. The gate and drain of the transistor P5 are connected together and further connected to the gate of the transistor P4, the sources of the transistors P6 and P7, and the drain of the transistor N2. The gates of the transistors N1 and N2 are connected to two differential voltage input terminals IP and IN. The gate of the transistor N3 is connected to a bias terminal VB2, and the source thereof is connected to a system low voltage VSS. The sources of the transistors P4 and P5 are connected to the voltage source VDD. The gates of the transistors P6 and P7 are connected to the polarity switching signal terminal PN.

The second input circuit 12 is formed by PMOS transistors P1, P2, and P3 and NMOS transistors N4, N5, N6, and N7. The sources of the transistors P1 and P2 are connected to the drains of the transistors P3 and N7. The drains of the transistors P1, N6, and N4 are connected together. The gate and drain of the transistor N5 are connected together, and further connected to the gate of the transistor N4, the source of the transistors N6 and N7, and the drain of the transistor P2. The gates of the transistors P1 and P2 are connected to the two differential voltage input terminals IP and IN, respectively. The gate of the transistor P3 is connected to the bias terminal VB 1, and the source thereof is connected to the voltage source VDD. The sources of the transistors N4 and N5 are connected to the system low voltage VSS. The gates of the transistors N6 and N7 are connected to the polarity switching signal terminal PN.

The inverter 13 is formed by a PMOS transistor P21 and an NMOS transistor N21. The input of the inverter 13 is connected to the polarity switching signal terminal PN and the output thereof generates an inverted signal ~PN.

The output transistor pair 15 is formed by connecting a PMOS transistor P12 to an NMOS transistor N12, wherein the drains of two transistors P12 and N12 are connected to one end of the compensation capacitor CC.

The switching circuit 14 is formed by a PMOS transistor P8 and an NMOS transistor N8. The gates of the two transistors P8 and N8 are connected together, and further connected to the output of the inverter 13. The drains of the two transistors P8 and N8 are connected together and further connected to another end of the compensation capacitor CC for being used as an output terminal OUT of the amplifier. The source of the transistor P8 is connected to the drains of the transistors N1, P6 and P4 of the first input circuit 11, and further connected to the gate of the transistor P12 of the output transistor pair 15. The source of the transistor N8 is connected to the drains of the transistors P1, N6 and N4 of the second input circuit 12, and further connected to the gate of the transistor N12 of the output transistor pair 15.

With the aforesaid circuit structure of the source drive amplifier in accordance with the present invention, when PN=VDD and a voltage signal higher than the voltage of the common electrode is to be output, the transistors N7 and N6 of the second input circuit 12 are on, and thus, the transistor P2 is deemed to be inactive. The transistors N4 and N5 are connected in parallel, while the transistors P6 and P7 of the first input circuit 11 are off without having any effect. The output ~PN of the inverter 13 is VSS. Therefore, the transistor P8 of the switching circuit 14 is on and the transistor N8 is off.

Figure 2:
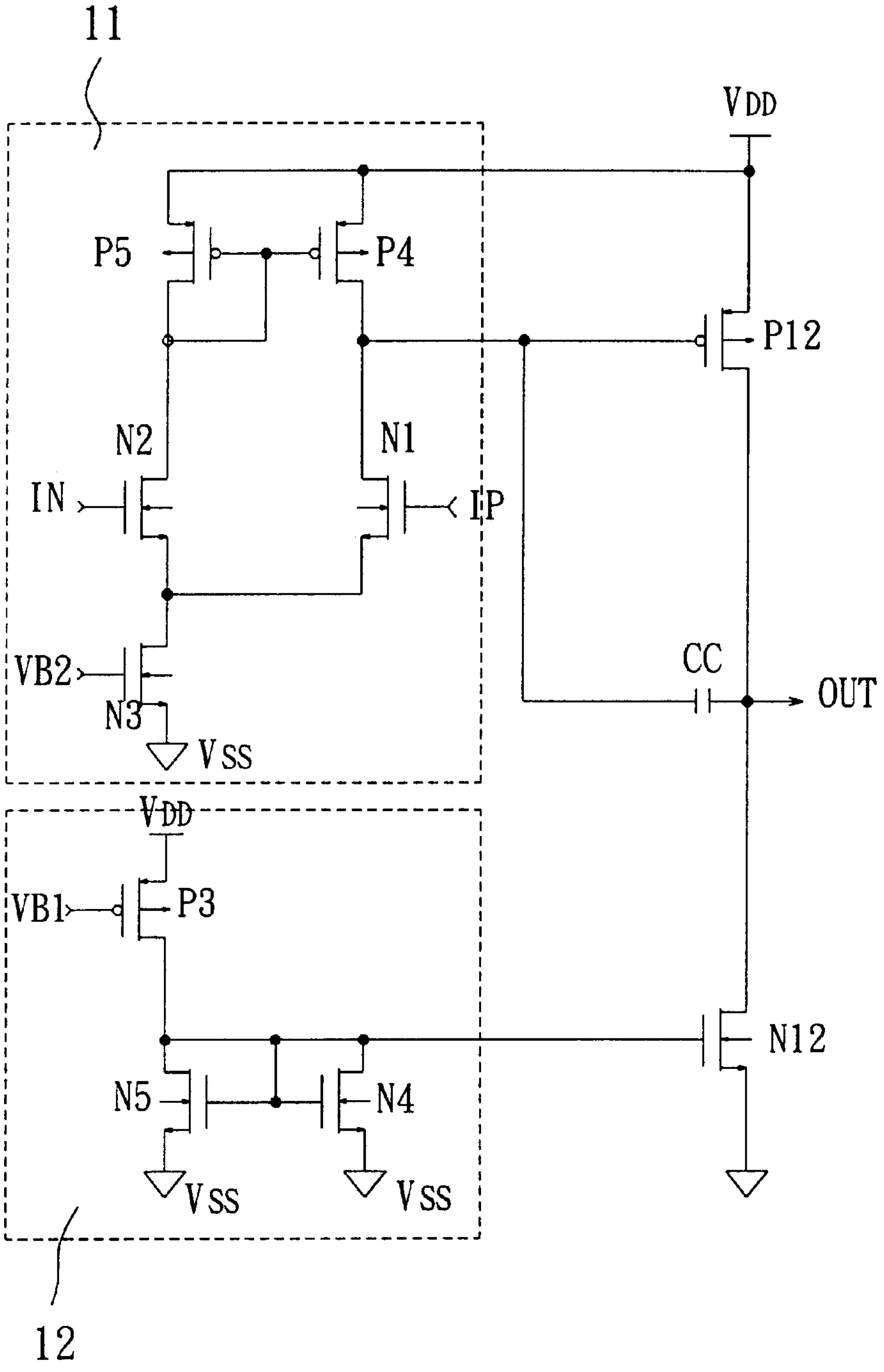
FIG. 2 shows an equivalent circuit of the source drive amplifier of a liquid crystal display in accordance with the present invention when PN=VDD.

As a result, when PN=VDD, the source drive amplifier in accordance with the present invention is equivalent to the circuit shown in FIG. 2. As shown in the figure, the second input circuit 12 is switched into a bias circuit. The parallel-connected transistors N4 and N5 together with the transistor N12 of the output transistor pair 15 are formed as a current mirror. The first input circuit 11 is switched into an NMOS differential amplifying circuit. The gates of the transistors N1 and 2 are differential input terminals. The current mirror formed by the transistors P4 and P5 is an active load of the transistors N1 and N2.

The output of the first input circuit 11, used as a differential amplifying circuit, drives the transistor P12 of the output transistor pair 15 for being used as an amplifying output stage of the source out, and the current from the transistor N12 is used as a bias. Thus, an A class amplifier with a large source out capability is formed as a source amplifier. The switching circuit 14 switches the output of the first input circuit 11 to connect to the compensation capacitor CC for compensating the phase of the transistor P12 and promoting the stability of the amplifier.

When PN=VSS and a voltage signal lower than the voltage of a common electrode is to be output, the transistors P7 and P6 of the first input circuit 11 are on. Thus, the transistor N2 has not effect, and the transistor P4 and P5 are connected in parallel. The transistors N6 and N7 are off and provide no effect. Furthermore, the output ~PN of the inverter 13 is VDD and thus, the transistor N8 of the switching circuit 14 is on and the transistor P8 is off.

Figure 3:
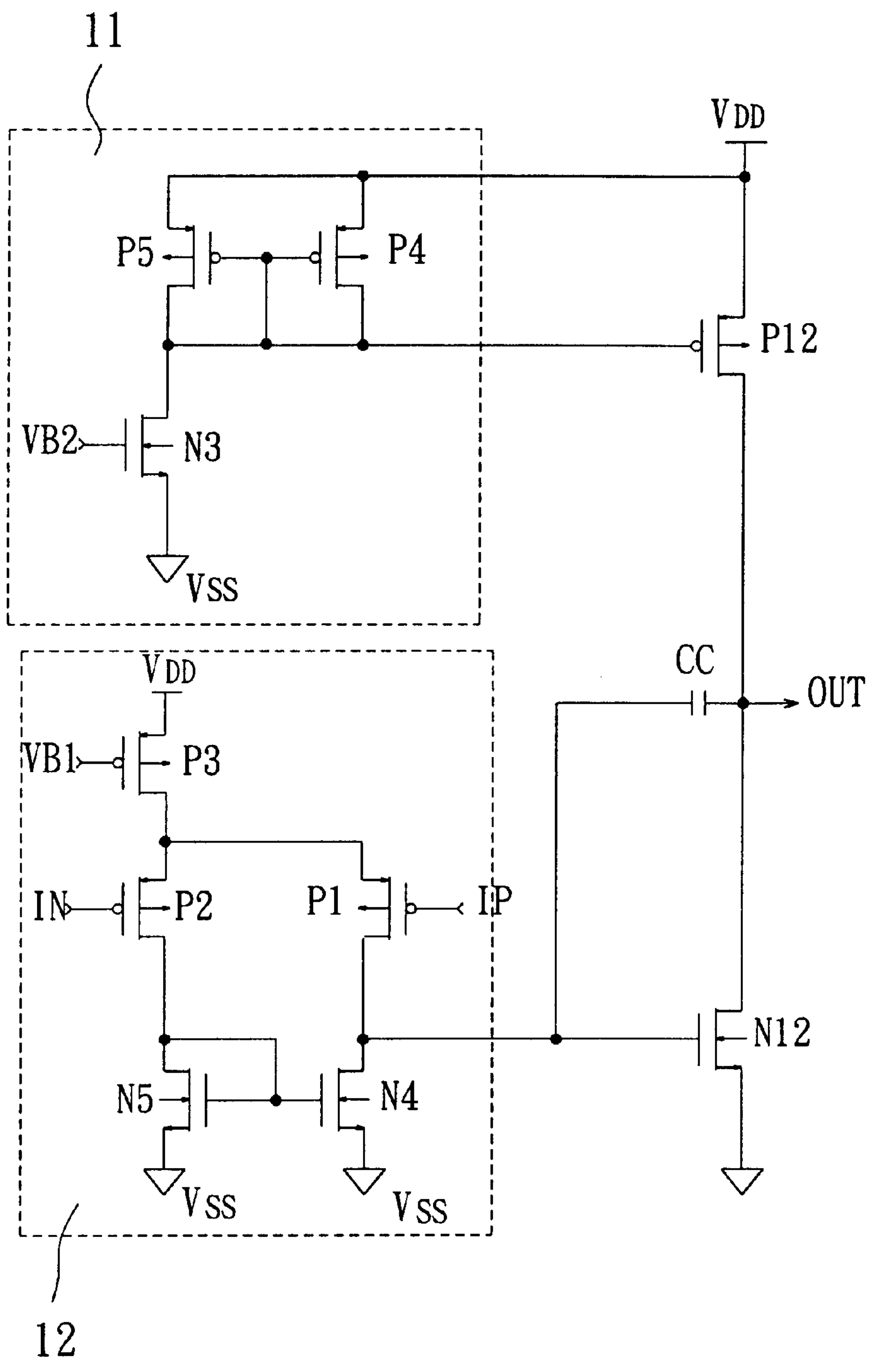
FIG. 3 shows an equivalent circuit of the source drive amplifier of a liquid crystal display in accordance with the present invention when PN=VSS.

Therefore, when PN VSS, the source drive amplifier in accordance with the present invention is equivalent to the circuit shown in FIG. 3. As shown in the figure, the first input circuit 11 is switched into a bias circuit, wherein the parallel-connected transistors P4 and P5 together with the transistor P12 of the output transistor pair 15 are formed as a current mirror circuit. The second input circuit 12 is switched into a PMOS differential amplifying circuit, wherein the gates of the transistors P1 and P2 are differential input terminals. The current mirror formed by the transistors N4 and N5 is an active load of the transistors P1 and P2.

The output of the second input circuit 12, used as a differential amplifying circuit, drives the transistor N12 of the output transistor pair 15 for being used as a sink in amplifying output stage. The current from the transistor P12 is used as a bias, thereby forming an A class amplifier with a large sink in capability for being used as a sink amplifier. The switching circuit 14 switches the output of the second input circuit 12 to be connected to the compensation capacitor CC so as to compensate the phase of the transistor N12 and promote the stability of the voltage.

With the above circuit structure, the source drive amplifier in accordance with the present invention can achieve the property and specification required by a thin film transistor liquid crystal display, and its DC offset characteristic is analyzed as follows:

When $V_{in} < V_{common}$, $$V_{OS\_L} = \frac{gm_{N4}\Delta V_{TH\_N4N5} + gm_{P1}\Delta V_{TH\_P1P2}}{gm_{P1}},$$

when $V_{common} < V_{in}$, $$V_{OS\_H} = \frac{gm_{P4}\Delta V_{TH\_P4P5} + gm_{N1}\Delta V_{TH\_N1N2}}{gm_{N1}}.$$

From above equations, it is known that the DC offset property of the source drive amplifier of the present invention is better than the conventional operational amplifier. Furthermore, the number of parameter that affect the DC offset property is less so that the design work is easier. In addition, there are only a few factors which negatively affect the yield. Thus, a higher yield can be obtained.

Besides, the amplifier of the present invention has a lower gain (one order smaller than the AB class amplifier), and there is no inductance in the output impedance. Thus, the compensation capacitor CC can be small.

Figure 4:
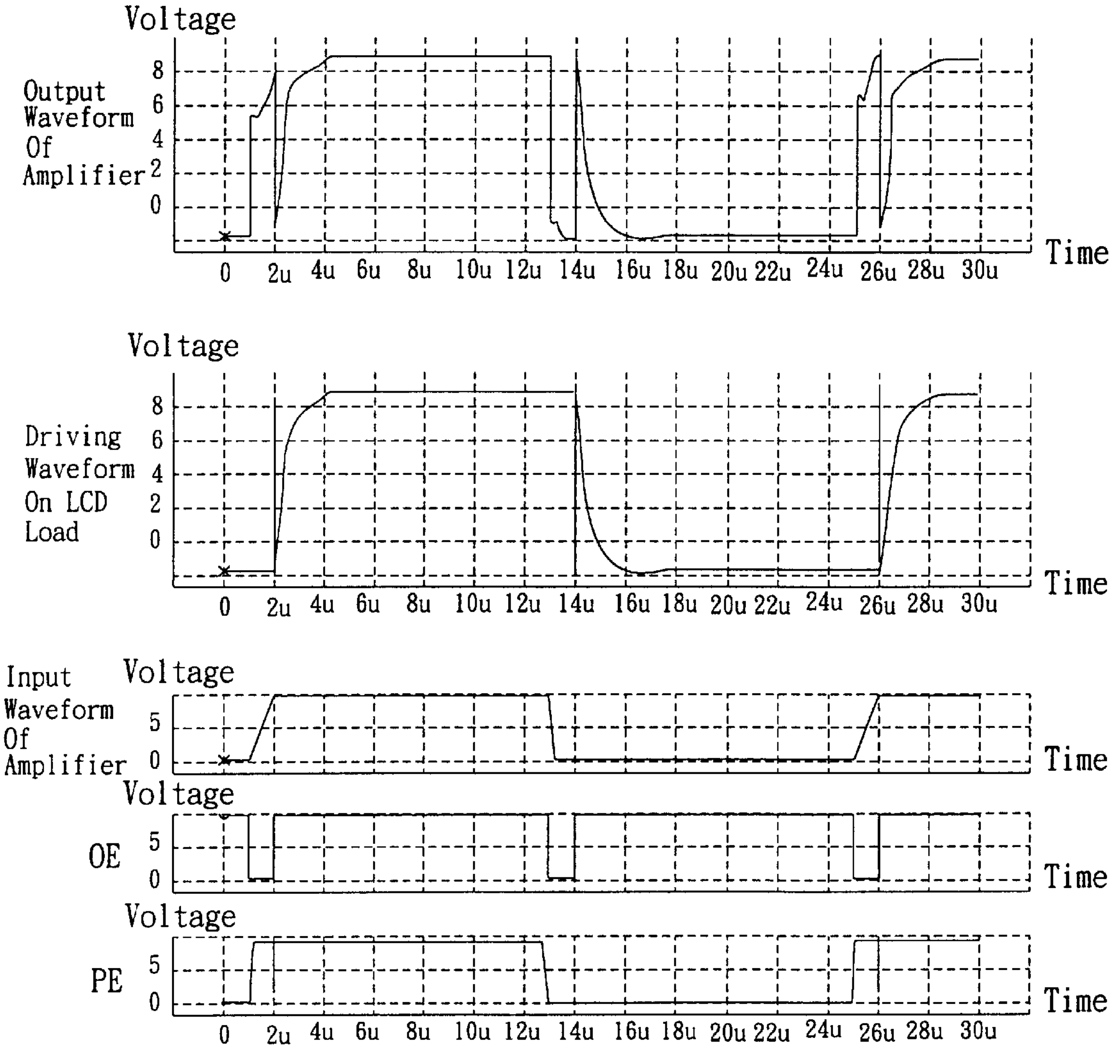
FIG. 4 shows the operating waveform of the source drive amplifier of a liquid crystal display in accordance with the present invention.
Figure 5:
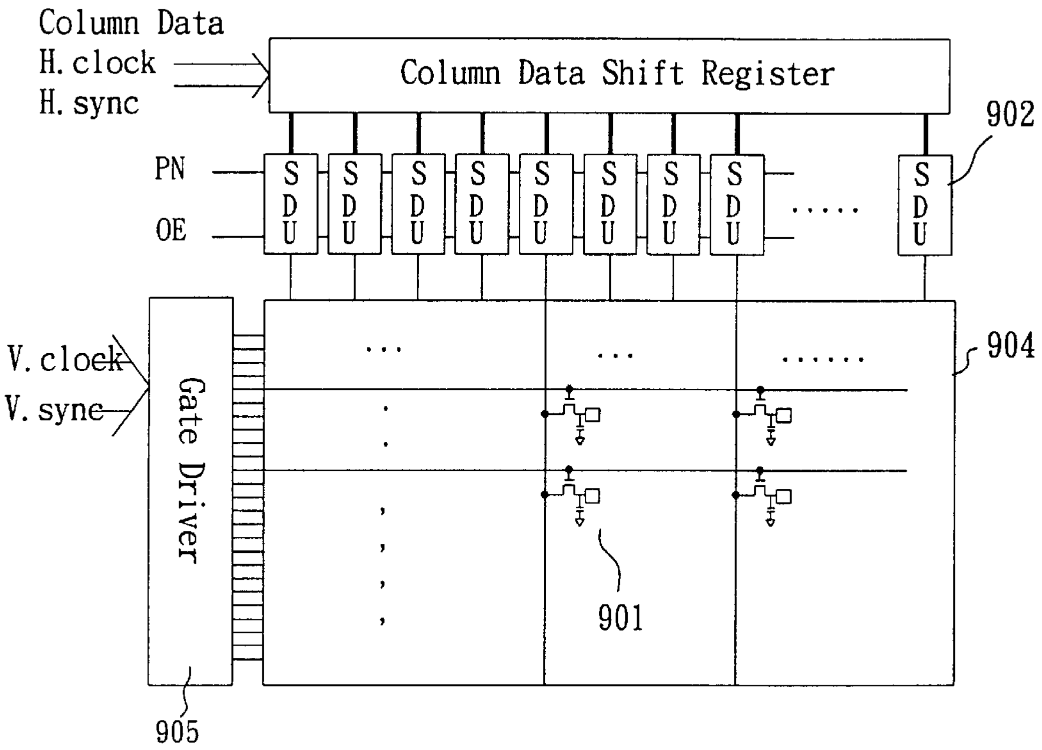
FIG. 5 PRIOR ART
FIG. 5 is a schematic view showing the driving structure of an active thin film liquid crystal display with K columns by L rows in the prior art.
Figure 6:
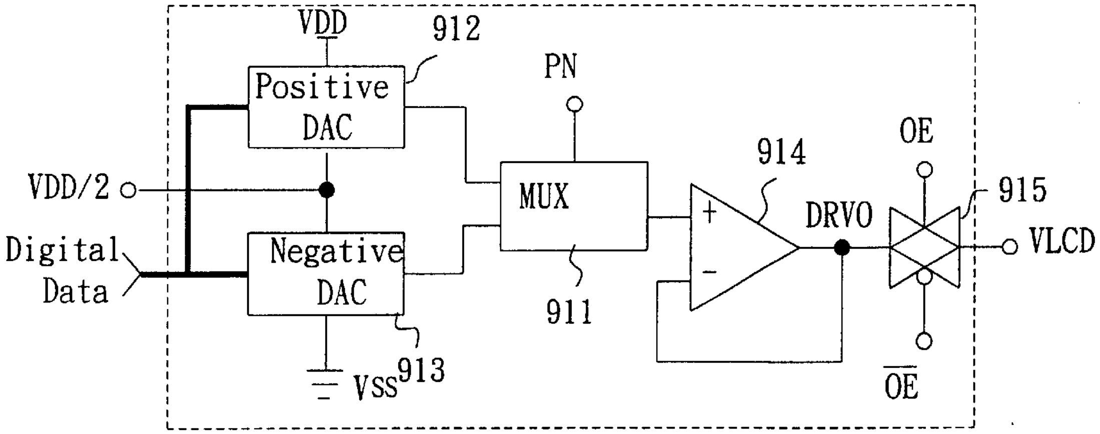
FIG. 6 PRIOR ART
FIG. 6 is a circuit diagram of the source drive unit of an active thin film liquid crystal display in the prior art.
Figure 7:
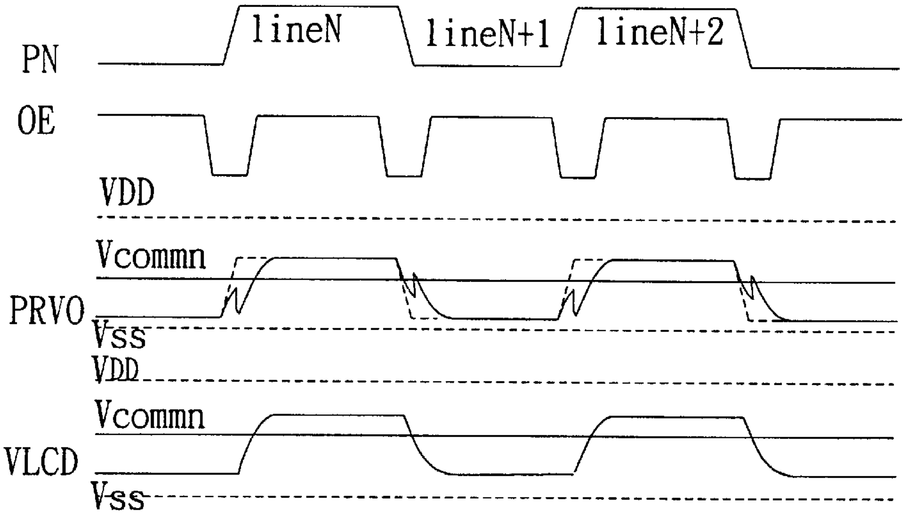
FIG. 7 PRIOR ART
FIG. 7 shows the driving waveform of the thin film liquid crystal display in the prior art.
Figure 8:
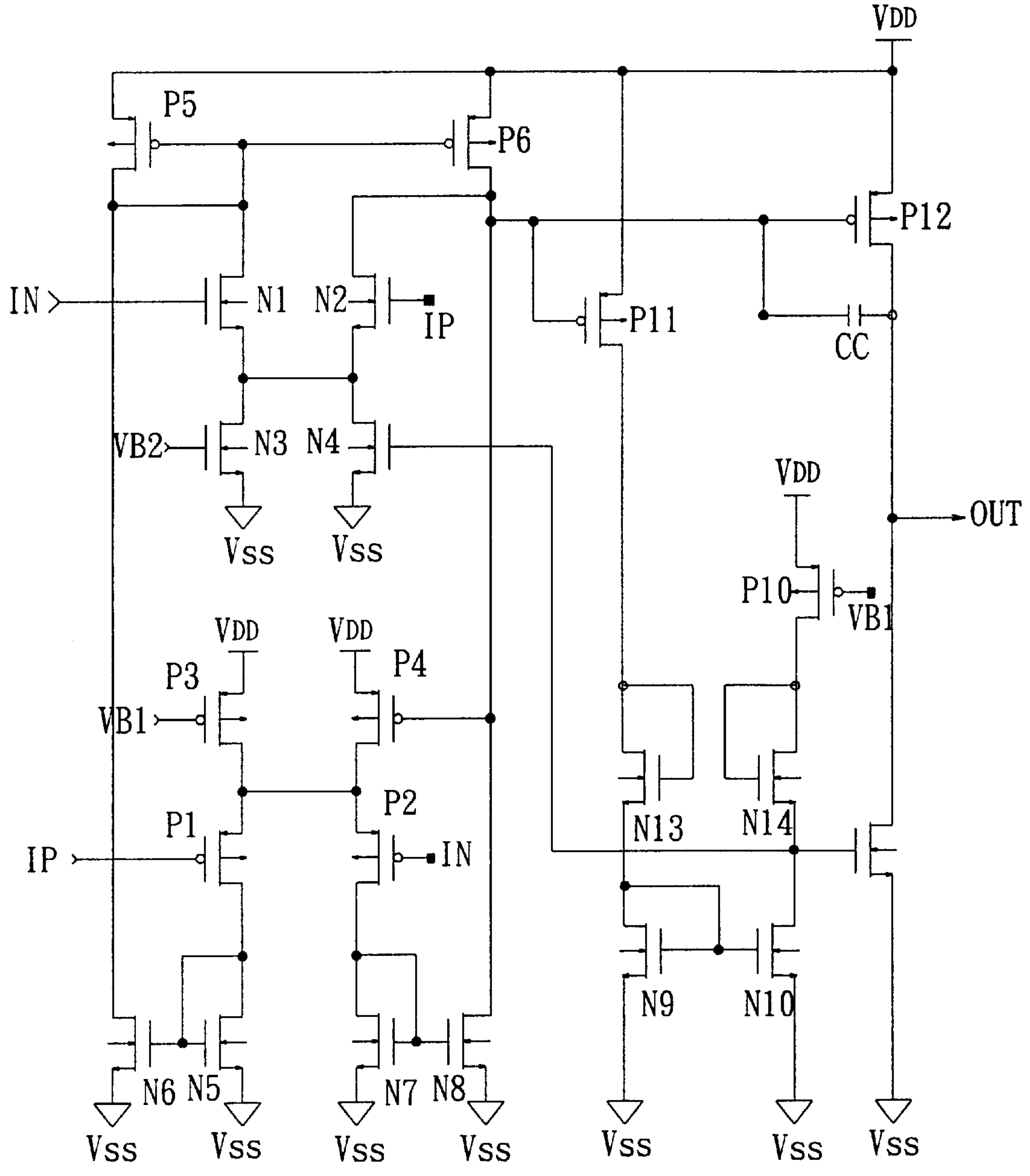
FIG. 8 PRIOR ART
FIG. 8 is a circuit diagram of an operational amplifier used in the source drive unit of a conventional liquid crystal display.
Figure 9:
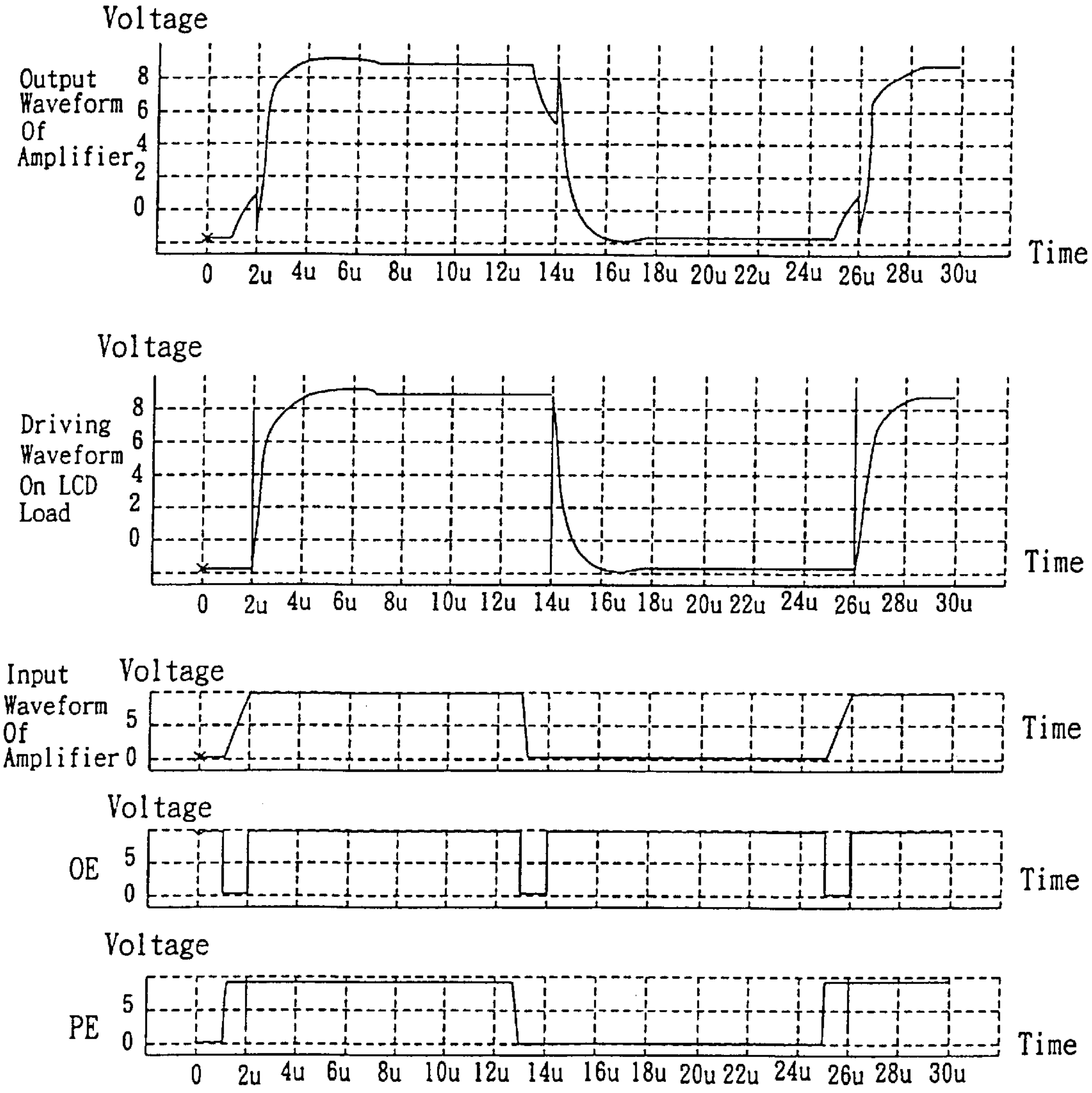
FIG. 9 PRIOR ART
FIG. 9 shows the operating waveform of a conventional thin film transistor liquid crystal display.

FIG. 4 shows the output driving waveform in accordance with the amplifier of the present invention. In comparing with the conventional amplifier, it is known that the waveform of the present invention moves quicker, and has a smaller overshoot. There are only 4 μs for the waveform to be stable (while the conventional amplifier requires 7 μs. Therefore, the driving speed can be quicker and the flicker phenomenon can be reduced.

Moreover, the amplifier in each channel of the source drive amplifier in accordance with the present invention can be switched into a source amplifier with a large current source out capability, or a sink amplifier with a large current sink in capability. Therefore, it can be used in a dot inversion driving system or a row inversion driving system. In addition, the polarity of the output of the source drive amplifier in accordance with the present invention is opposite to that of the former one for each time, and the pull-up and pull-down capability are switched simultaneously. Therefore, there is no potential reset required.

Although the present invention has been explained in relation to its preferred embodiment, it is to be understood that many other possible modifications and variations can be made without departing from the spirit and scope of the invention as hereinafter claimed.

What is claimed is:

1. A source drive amplifier of a liquid crystal display comprising:

a first input circuit controlled by a polarity switching signal for being selectively switched into an NMOS differential amplifying circuit and a bias circuit;

a second input circuit controlled by a polarity switching signal for being selectively switched into a bias circuit and a PMOS differential amplifying circuit, wherein, when the polarity switching signal is in a first state, the first and second input circuits are switched into an NMOS differential amplifying circuit and a bias circuit, respectively, and when the polarity switching signal is in a second state, the first and second input circuits are switched into a bias circuit and a PMOS differential amplifying circuit; and an output transistor pair having an NMOS transistor and a PMOS transistor, wherein, an output of the first input circuit switched into an NMOS differential amplifying circuit drives the PMOS transistor of the output transistor pair for being used as a source out amplifying output stage, and a current provided by the NMOS transistor is used as a bias: and an output of the second output circuit switched into a PMOS differential amplifying circuit drives the NMOs transistor of the output transistor pair for being used as a sink in amplifying output state, and a current provided by the PMOS transistor is used as a bias, wherein the first input circuit is formed by first, second, and third NMOS transistors, and fourth, fifth, sixth, and seventh PMOS transistors; the sources of the first and the second NMOS transistors are connected to the drains of the third NMOS and the seventh PMOS transistors; the drains of the first NMOS, the sixth and the fourth PMOS transistors are connected together; the gate and the drain of the fifth PMOS transistor are connected together and further connected to the gate of the fourth PMOS transistor, the sources of the sixth and seventh PMOS transistors, and the drain of the second NMOS transistor; the gates of the first and second NMOS transistors are connected to a first and a second differential voltage input terminal, respectively; the gate of the third NMOS transistor is connected to a first bias end, and the source thereof is connected to a system low voltage; the sources of the fourth and fifth PMOS transistors are connected to a voltage source; and the gates of the sixth and seventh PMOS transistors are connected to a polarity switching signal end.

2. The source drive amplifier of a liquid crystal display as claimed in claim 1, wherein the second input circuit is formed by first, second, and third PMOS transistors, and fourth, fifth, sixth, and seventh NMOS transistors; the sources of the first and the second PMOS transistors are connected to drains of the third PMOS and the seventh NMOS transistors; the drains of the first PMOS, the sixth and fourth NMOS transistors are connected together and further connected to the gate of the fourth PMOS transistor, the sources of the sixth Y and seventh NMOS transistors, and the drain of the second PMOS transistor; the gates of the first and second PMOS transistors are connected to first and second differential voltage input terminals, respectively; the gate of the third PMOS transistor is connected to a second bias terminal, and the source thereof is connected to a voltage source; the sources of the fourth and fifth NMOS transistors are connected to a system low voltage; and the gates of the sixth and seventh NMOS transistors are connected to a polarity switching terminal.

3. The source drive amplifier of a liquid crystal display as claimed in claim 2, further comprising:

a compensation capacitor; and a switching circuit for switching an output of the first input circuit to be connected to the compensation capacitor when the polarity switching signal is at a first state; and switching an output of the second input circuit to be connected to the compensation capacitor when the polarity switching signal is at a second state.

4. The source drive amplifier of a liquid crystal display as claimed in claim 3, further comprising an inverter for inverting the polarity switching signal to generate an inverted polarity switching signal for being input to the switching circuit to determine the state of the polarity switching signal.

5. The source drive amplifier of a liquid crystal display as claimed in claim 3, wherein the inverter is formed by a PMOS transistor and an NMOS transistor for inverting the polarity switching signal to generate an inverted signal.

6. The source drive amplifier of a liquid crystal display as claimed in claim 3, wherein the output transistor pairs are formed by a PMOS transistor and an NMOS transistor, and drains of the two transistors are connected to one end of the compensated capacitor.

7. The source drive amplifier of a liquid crystal display as claimed in claim 6, wherein the switching circuit is formed by a PMOS transistor and an NMOs transistor; the gates of the two transistors are connected together, and further connected to an output of the inverter; the drains of the two transistors are connected together, and further connected to another end of the compensation capacitor; the source of the PMOS transistor of the switching circuit is connected to the drain of the first NMOS transistor of the first input circuit and the gate of the PMOS transistor of the output transistor pair; the source of the NMOS transistor of the switching circuit is connected to the drain of the first PMOS transistor of the second input circuit and the gate of the NMOS transistor of the output transistor pair.

8. The source drive amplifier of a liquid crystal display as claimed in claim 7, wherein the first state of the polarity switching signal is a potential of the voltage source.

9. The source drive amplifier of a liquid crystal display as claimed in claim 1, wherein the second state of the polarity switching signal is the system low voltage.

* * * * *